United States Patent [19]
Yuen et al.

[11] Patent Number: 5,886,746
[45] Date of Patent: *Mar. 23, 1999

[54] METHOD FOR CHANNEL SCANNING

[75] Inventors: Henry C. Yuen, Redondo Beach; Elsie Y. Leung, South Pasadena, both of Calif.

[73] Assignee: Gemstar Development Corporation, Pasadena, Calif.

[ * ] Notice: The term of this patent shall not extend beyond the expiration date of Pat. No. 5,673,089.

[21] Appl. No.: 889,786

[22] Filed: Jul. 8, 1997

Related U.S. Application Data

[63] Continuation of Ser. No. 679,652, Jul. 11, 1996, Pat. No. 5,673,089, which is a continuation of Ser. No. 354,964, Dec. 13, 1994, abandoned.

[51] Int. Cl.$^6$ ........................................ H04N 5/445
[52] U.S. Cl. .................... 348/564; 348/731; 348/565; 348/586; 348/734
[58] Field of Search .................... 348/731, 732, 348/734, 564, 565, 567, 586, 906; 386/83; H04N 5/445, 5/50

[56] References Cited

U.S. PATENT DOCUMENTS

| | | | |
|---|---|---|---|
| 4,170,782 | 10/1979 | Miller | 358/84 |
| 4,355,415 | 10/1982 | George et al. | 455/185 |
| 4,375,651 | 3/1983 | Templin et al. | 358/191.1 |
| 4,392,247 | 7/1983 | van Deursen | 455/161 |
| 4,495,654 | 1/1985 | Deiss | 455/151 |
| 4,706,121 | 11/1987 | Young et al. | 358/142 |
| 4,746,983 | 5/1988 | Hakamada | 348/565 |
| 4,776,038 | 10/1988 | Testin et al. | 348/732 |
| 4,870,492 | 9/1989 | Hakamada et al. | 358/193.1 |
| 4,959,719 | 9/1990 | Stubbe et al. | 358/183 |
| 4,959,720 | 9/1990 | Duffield et al. | 358/191.1 |
| 4,969,209 | 11/1990 | Schwob | 455/158 |
| 5,045,947 | 9/1991 | Beery | 358/192.1 |
| 5,068,734 | 11/1991 | Beery | 358/191.1 |
| 5,182,646 | 1/1993 | Keenan | 348/732 |
| 5,194,954 | 3/1993 | Duffield | 358/193.1 |
| 5,210,611 | 5/1993 | Yee et al. | 358/191.1 |
| 5,251,034 | 10/1993 | Na | 348/731 |
| 5,296,931 | 3/1994 | Na | 348/731 |
| 5,317,403 | 5/1994 | Keenan | 348/731 |
| 5,323,240 | 6/1994 | Amano et al. | 348/731 |
| 5,353,121 | 10/1994 | Young et al. | 348/563 |

(List continued on next page.)

FOREIGN PATENT DOCUMENTS

| | | | |
|---|---|---|---|
| 0512618 | 11/1992 | European Pat. Off. | H04N 5/50 |
| 4044475 | 2/1992 | Japan | H04N 5/445 |

OTHER PUBLICATIONS

Japanese Patent Abstract, Publication No. JP 3178278 A, Publication Date Aug. 02, 1991, p. 3, H04N$^5$ 5/44.

Japanese Patent Abstract, Publication No. JP 4044475 A, Publicaton Date Feb. 14, 1992, p. 4, H04N$^5$ 5/445.

*Primary Examiner*—Sherrie Hsia
*Attorney, Agent, or Firm*—Christie, Parker & Hale, LLP

[57] ABSTRACT

Apparatus and methods are provided for selecting channels on a television system by theme. A remote controller for the television system includes a plurality of theme keys, each theme key corresponding to one theme of a plurality of themes, apparatus for entering channel indicators corresponding to each theme, apparatus for storing the entered channel indicators corresponding to each theme, apparatus for accessing and transmitting to the television system each channel indicator corresponding to a first theme of the plurality of themes in sequence to control channel selection for the television system, if a first theme key corresponding to the first theme is pressed, apparatus for pausing a set period of time after accessing and transmitting a channel indicator before continuing to access and transmit channel indicators corresponding to the first theme in sequence, and apparatus for stopping the apparatus for accessing and transmitting from accessing and transmitting each channel indicator corresponding to a first theme of the plurality of themes in sequence, if the first theme key is pressed again.

9 Claims, 6 Drawing Sheets

U.S. PATENT DOCUMENTS

| | | | |
|---|---|---|---|
| 5,371,550 | 12/1994 | Shibutani et al. | 348/570 |
| 5,408,692 | 4/1995 | Suzuki et al. | 455/186.1 |
| 5,453,796 | 9/1995 | Dutfield et al. | 348/567 |
| 5,517,254 | 5/1996 | Montu et al. | 348/906 |
| 5,557,338 | 9/1996 | Maze et al. | 348/565 |
| 5,596,373 | 1/1997 | White et al. | 348/906 |
| 5,659,367 | 8/1997 | Yuen | 348/731 |
| 5,673,089 | 9/1997 | Yuen et al. | 348/734 |

FIG. 3

THEME MEMORY

110:
- (ESPN) 15
- (PRIME TICKET) 39
- (ABC) 7
- (CBS) 2

104

112:
- (CNN) 14
- (HEADLINE NEWS) 50
- (CSPAN) 10
- (NBC) 4

114:
- (VH-1) 47
- (MTV) 43

116:
- (HBO) 48
- (SHOWTIME) 49
- (BRAVO) 46

118:
- (THE DISNEY CHANNEL) 44
- (NICKELODEON) 37
- (DISCOVERY) 21
- (THE LEARNING CHANNEL) 27

120:
- (CBS) 2
- (NBC) 4
- (ABC) 7
- (KCAL) 9

METHOD FOR CHANNEL SCANNING

CROSS-REFERENCE TO RELATED APPLICATIONS

This is a continuation of application Ser. No. 08/679,652 filed Jul. 11, 1996 (now U.S. Pat. No. 5,673,089), which is a continuation of application Ser. No. 08/354,964 filed Dec. 13, 1994 (now abandoned).

BACKGROUND OF THE INVENTION

1. Field of the Invention

This invention relates to controlling channel selection on a television and particularly to apparatus and methods for selecting channels by theme.

2. Description of the Related Art

In presently used television systems, many channels are available that broadcast a wide range of topics including news, sports, movies, programming for kids, and music. Due to the large number of channels available via cable and satellite receivers, a viewer is often overwhelmed when selecting a channel for viewing. Even when the viewer knows the exact program and broadcast channel (for example, Prime Ticket on channel 39) the viewer may still have trouble locating the program because cable channel numbers are often different depending on the cable channel company that is transmitting the channels. Guides are published which describe the local programming; however, the guides are increasing complicated to read and not always up to date. When a user turns on a television system, the user often knows the program theme that he or she wishes to watch. For example, the user may wish to watch news. If the user does not know the channel number of a particular news station, then the user will often use a remote controller to scan through the channels until a channel with news is found. The user does this by pressing the channel up or down command on the remote controller. This method of scanning the channels available on a television system is often called channel surfing. The user surfs the channels until a program is found that matches the theme the user wishes to watch.

A number of attempts have been made to make the selection of channels corresponding to a particular theme easier to accomplish.

U.S. Pat. No. 5,296,931 (Na) discloses a channel selecting method for programs of the same category. Arbitrary channels are assigned according to the same types of programs as those contained in signals broadcast from a broadcasting station using a VPS function. The method determines whether a received broadcast signal uses the video program system (VPS broadcasting) and recognizes codes corresponding to the programs and arbitrarily assigns channels for the programs according to the codes. Then, if a desired channel is selected, the same types of programs corresponding to that channel can be automatically recognized, so that the broadcasting channel selection for viewing the same type of programs can be easily performed.

For example, the character "A" may be assigned to amusement programs, the character "B" to sports programs and the character C to serial dramas and encoded onto the video signal output. The VPS data is sent during the vertical blanking interval of the video signal.

A disadvantage of Na is that a user must first select a desired channel before other channels having the same types of programs can be automatically recognized. Also Na requires that the VPS broadcasting signal be used and requires the availability of a television system that can recognize the VPS data embedded in the vertical blanking interval of the video signal.

U.S. Pat. No. 5,210,611 (Yee) discloses an apparatus and technique for automatically tuning an audio video device in accordance with a topic selection made by user. Knowledge of specific broadcast of programs and times is not necessary. A user makes a selection of a subject matter from a menu or list and necessary tuning is thereafter automatically done under control of a menu or list control interface. Digital information is transmitted in the vertical blanking interval to provide a menu. The menu control interaction automatically adjusts the tuner in accordance with the menu selection made by the user to choose an arbitrary channel and page of information within that channel. Digital data is transmitted with the broadcast signal to characterize the subject matter content of the broadcast signal. The tuner will seek to any arbitrary frequency having a digital code matching the subject matter chosen by the user.

Yee has the disadvantage that a television system must have a means of decoding the digital information in the vertical blanking interval. Another disadvantage of Yee is that although a menu is used to select a particular channel or a category of programs, the accessed channel may not have the program that the user wishes to view. Thus, the user must reaccess the menu and select the proper subject matter again and go to another channel within the subject matter and repeat this process until a channel is found that the user wishes to view.

U.S. Pat. No. 4,969,209 (Schwob) discloses a broadcast receiver capable of selecting a broadcast station based upon a user selected program format and the geographical location of the receiver. After a user inputs the geographical location of the receiver in the desired program format the data base may be scanned to select a broadcast frequency corresponding to the input geographical location and program format for retrieval. The apparatus has a number of format selection keys which may be as follows: classical, CNW for country and western, rock, jazz, and talk for news, sports and public affairs.

The disadvantage of Schwob is that similar to Yee, the data base is accessed to select a particular broadcast frequency which is then tuned to. If the user does not wish to listen to that broadcast frequency then the user must reaccess the data base for selection of another broadcast frequency having the same desired format.

U.S. Pat. No. 4,375,651 (Templin) is a system for controlling a receiver to tune to only a selective set of channels. Separate groups of VHF, UHF or CATV channels are programmed by means of a key switch having various positions of engagement corresponding to individual groups of channels. Following key switch selection of a given group of channels, any number of channels within that group may be programmed for viewing by means of channel up and down selector keys. A RAM is used to store saved and skipped channels for each key switch position.

Templin allows a user to set a selected set of channels as the preferred channels. Once these preferred channels have been selected then the tuner will only tune to those channels. This saves some time in searching channels for a particular program; however, Templin does not allow the user to select a program category or theme. Thus, the user is required to search through all the selected channels to find channels having a particular theme.

U.S. Pat. No. 5,251,034 (Na) provides an automatic picture-in-picture (PIP) channel search apparatus and method for, when operating the scan key while the user is watching TV or a video tape on a video cassette recorder using the TV having a PIP function, searching channels by taking the currently viewed picture as a main screen and taking the searched broadcasting channels as subscreens, to thereby facilitate channel selection. The automatic PIP channel search apparatus and method involves the steps of setting the currently viewed broadcast signals in a main screen if a scan key is input when watching a TV channel, setting broadcast channels excluding the channel set as the main screen, as subscreens to display in turn the subscreen channels, and displaying only a specific channel broadcast on the main screen, if the scan key signal is input again.

Na has the disadvantage that each of the TV channels excluding the channel being displayed as the main screen are displayed as a PIP in turn. This does allow the user to surf through the channels; however the user must scan through all of the TV channels to find a channel having a desired theme. This is very similar to surfing through all the channels by pressing the channel up or down buttons on a remote controller for reviewing all the channels to find a channel with a particular theme. Due to the large number of channels available on current cable and satellite systems, the user is greatly inconvenienced by having to search through all of the channels.

Japanese patent application 02-152453 (Yoshihisa) filed Jun. 11, 1990 and published on Feb. 14, 1992 with publication No. 04-044475, discloses a channel selection control section that controls an on-screen display as required to display on the screen of a television a category menu. A user can select a category from the category menu and then the tuner is controlled to select channels corresponding to all broadcast stations belonging to the selected category. Each channel corresponding to the selected category is displayed sequentially on the screen together with an indication of the broadcast station name. Each channel is displayed for a prescribed time. A desired channel is selected by depressing an enter key when the picture of the desired broadcast station is displayed on the television.

Yoshihisa has the disadvantage that an on-screen display is required to display the category menu. Also required is a method for the user to select a category from the on-screen display such as a cursor on the screen. The on-screen display requires additional hardware in a television or other associated apparatus and if a cursor is used to select a particular channel, then this also requires additional hardware in the television.

Accordingly, there is a need in the art for apparatus and methods for selecting channels by theme, which overcome the foregoing shortcomings.

SUMMARY OF THE INVENTION

An object of the present invention is to provide a more convenient method of selecting a channel on a television system.

Another object of the present invention is to provide a more convenient method of selecting a channel with a certain theme.

Another object of the present invention is to reduce the time required to "surf" through channels to find a program with a particular theme.

According to the invention, apparatus and methods are provided for selecting channels by theme. A remote controller for the television system includes a plurality of theme keys, each theme key corresponding to one theme of a plurality of themes, apparatus for entering channel indicators corresponding to each theme, apparatus for storing the entered channel indicators corresponding to each theme, apparatus for accessing and transmitting to the television system each channel indicator corresponding to a first theme of the plurality of themes in sequence to control channel selection for the television system, if a first theme key corresponding to the first theme is pressed, apparatus for pausing a set period of time after accessing and transmitting a channel indicator before continuing to access and transmit channel indicators corresponding to the first theme in sequence, and apparatus for stopping the apparatus for accessing and transmitting from accessing and transmitting each channel indicator corresponding to a first theme of the plurality of themes in sequence, if the first theme key is pressed again.

Other objects and many of the attendant features of this invention will be more readily appreciated as the same becomes better understood by reference to the following detailed descriptions and considered in connection with the accompanying drawings in which like reference symbols designate like parts throughout the figures.

DETAILED DESCRIPTION

Figure 1:
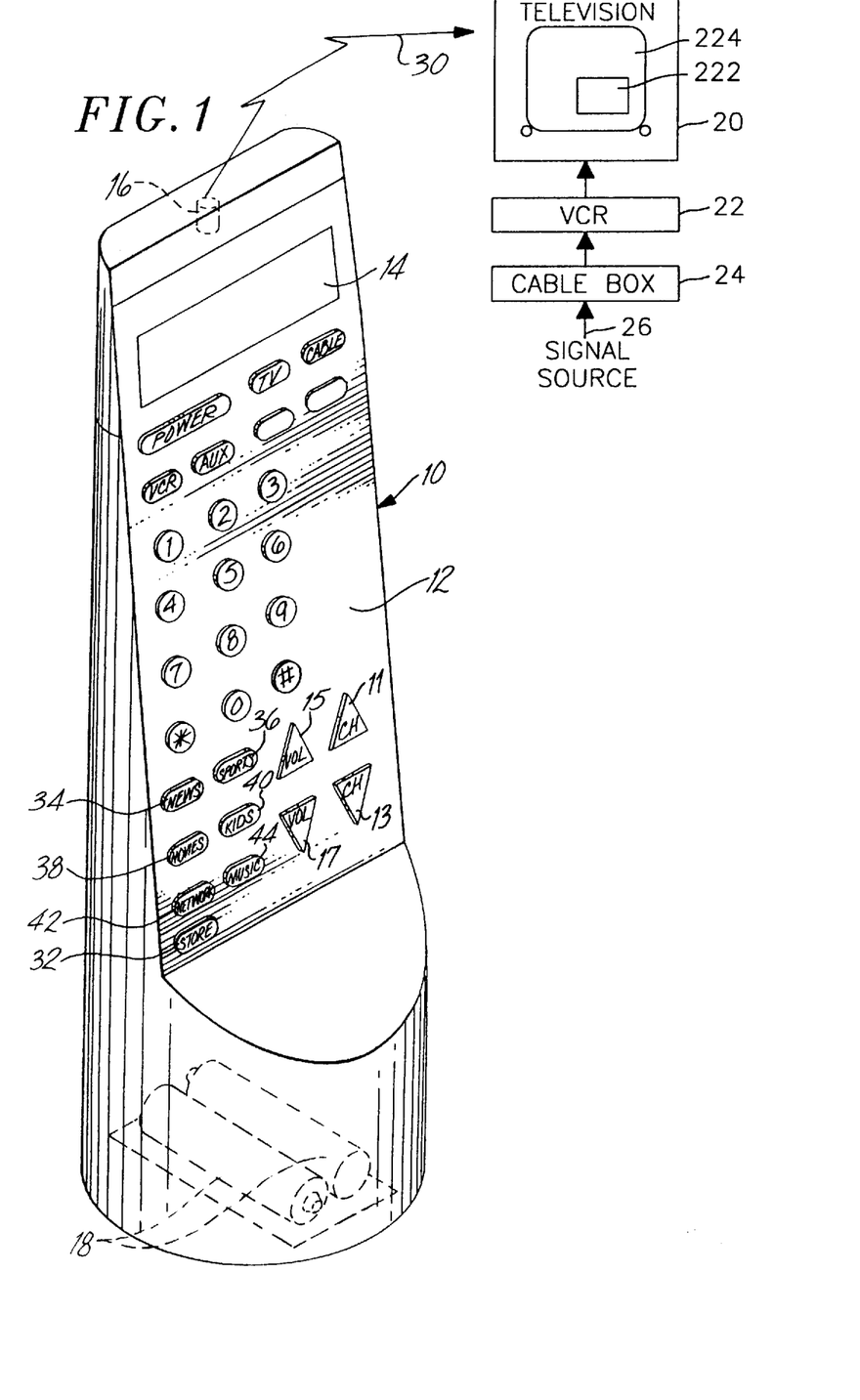
FIG. 1 is a drawing of a remote controller for selecting channels on a television system by theme according to the present invention.

Referring now to the drawings, and more particularly, to FIG. 1, a remote controller 10 is shown which can be used for controlling a television system consisting of television 20, VCR 22 and cable box 24. The intent of this invention is to be able to control any portion of the television system. Sometimes the remote controller is used to control channels directly on a television. Sometimes the remote controller is used to change channels on a cable box or on a VCR rather than on the television. As shown, the television system receives a signal source 26 which can be from a cable, or an antenna, or a satellite receiver.

The remote controller has a keypad 12 which includes number keys, channel up and down keys 11 and 13, and volume up and down keys 15 and 17. Other keys on the remote controller can include power, and mode select keys such as TV, cable, VCR, and AUX. These mode select keys are primarily used to control the mode of a universal remote controller. The remote controller is powered by batteries 18, and has a display 14 and an infrared transmitter 16 which is used to transmit signals 30 to the television system. The display 14 can be used to display the mode of the universal remote controller, channel selections, and other information. The remote controller 10 can also be a remote controller for only a particular appliance such as a television.

In addition to the keys that have been described above which are common keys on many remote controllers, the remote controller 10 also has a plurality of theme keys including news key 34, sports key 36, movies key 38, kids key 40, network key 42 and music key 44. The remote controller also has a store key 32. The function of these keys is described below.

Figure 2:
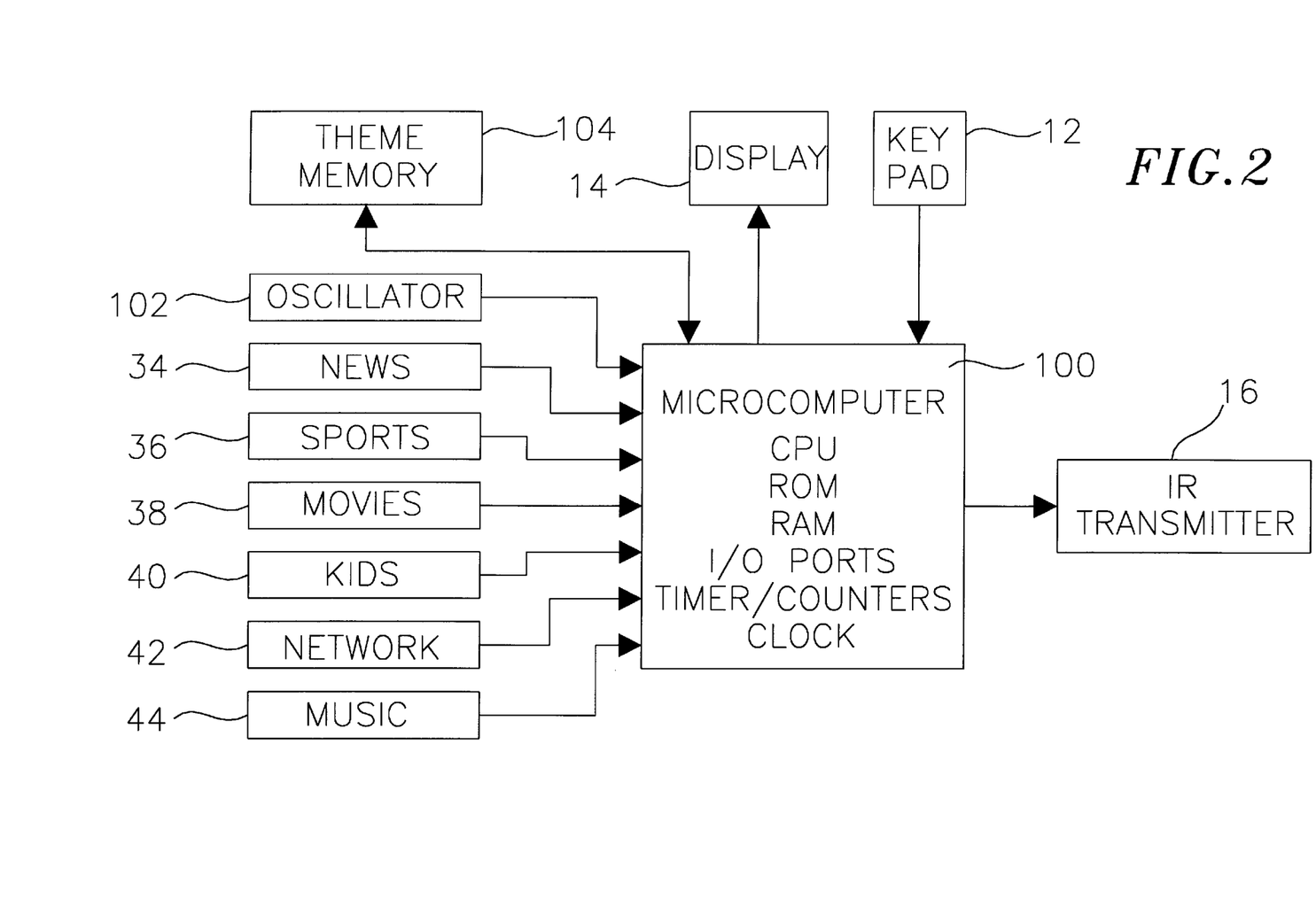
FIG. 2 is a block diagram of a remote controller for selecting channels on a television system by theme according to the present invention.

FIG. 2 is a block diagram of the remote controller 10. The remote controller has a microcomputer which has a CPU, a ROM, a RAM, I/O ports, timers and counters and a clock. An oscillator 102 is used to provide a frequency for the clock. As shown the display 14, the keypad 12, and the IR transmitter 16 interface with the microcomputer 100. Also shown are the theme keys 34, 36, 38, 40, 42 and 44. A theme memory 104 whose function is described below is shown connected to microcomputer 100. The theme memory can be a separate memory as shown in FIG. 2 or can be a portion of the ROM or the RAM of the microcomputer 100.

The operation of the theme keys will now be described. The first step in using the theme keys is to store selected channels under each theme key. These channels are stored in theme memory 104. Many methods can be used to enter channels for a particular theme key into the theme memory 104. For example, on screen programming can be used to assist in this procedure. The user can use a television program guide to look up channels that the user wishes to store under each theme key or the program guide can be electronically provided and displayed on the television. To store a channel under a particular theme key the user presses the store key 32, enters the channel number, and then presses the proper theme key. For example, suppose a user wishes to store the channel number corresponding to CNN under the news key 34. The user first presses the store key 32, then enters the channel number for CNN, which the user looks up in a television program guide, and then the user presses the news key 34. The channel number for the selected channel is entered using the keypad on remote controller 10. The user repeats these steps for storing as many channels as the user wishes under each theme key.

If the user enters a channel number and then decides to not store the channel number, the entry of the channel number can be cleared by pressing a clear key (not shown) on the remote controller.

Figure 3:
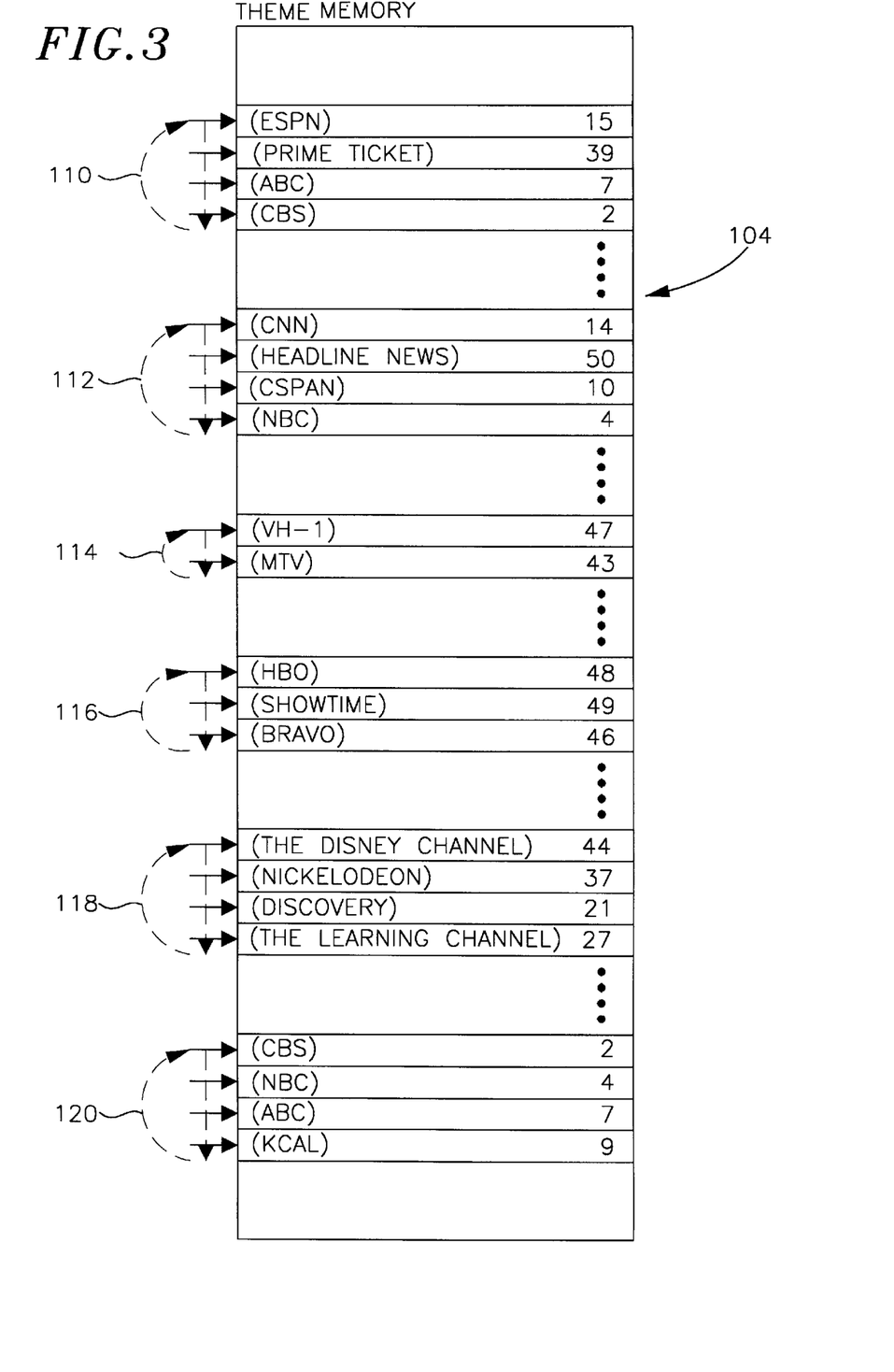
FIG. 3 is a diagram illustrating the content of a theme memory in a remote controller according to the present invention.

FIG. 3 is a diagram illustrating the content of the theme memory 104 after the user has entered selected channels for each theme key. As shown, under sports key 36 the user has entered channel numbers corresponding to ESPN, Prime Ticket, ABC, and CBS which are channels 15, 39, 7 and 2. These channels are accessed via a memory pointer 110. Under the news key 34, the user has entered into the theme memory the channel numbers corresponding to CNN, Headline News, CSPAN and NBC, which are on channels 14, 50, 10 and 4 and which are accessed via pointer 112. Under the music key 44 the user has stored channel numbers 47 and 43 corresponding to VH-1 and MTV, which are accessed via pointer 114. Under movies key 38 the user has stored channel numbers 48, 49 and 46 corresponding to HBO SHOWTIME and BRAVO, which are accessed via pointer 116. Then under the kids key 40, the user has stored into theme memory 104, channel numbers 44, 37, 21, and 27 corresponding to The Disney Channel, Nickelodian, Discovery, and The Learning Channel, which are accessed via pointer 118. Finally under the network key 42, the user has stored the channels 2, 4, 7, and 9, which correspond to CBS, NBC, ABC and KCAL, which are accessed via pointer 120.

The channel numbers stored under each key are entirely up to the user. For example, under sports the user in this case chose to store ABC and CBS; however, these channels also provide programming other than sports. The fact that these channels contain programming other than sports is known to the user and the user can still decide to store those channels under the sports key. Similarly under the news key, the CNN channel is known to be a news channel as well as Headline News; however, it is known that NBC only has news at certain times. However, the user may know that NBC will have news at 6:00 p.m. and for this reason may wish to include this channel under the news theme key.

In a specific embodiment the user can also enter into the theme memory along with a channel, times for which the channel is enabled. For example, for the entry of NBC under the news theme key 34 the user can enter the times 8:00 a.m.–8:30 a.m., 6:00 p.m.–7:00 p.m. and 10:00 p.m.–10:30 p.m. These time ranges can then be used to enable the NBC channel for channel viewing only at those times. At other times the NBC channel is skipped over.

The theme keys may have other designations. For example, the network key could be instead a public broadcasting station (PBS) key. A PBS key would contain channels such as KCET, which is a public broadcasting station channel. The number of theme keys is a matter of choice for the manufacturer of the remote controller. The theme keys on a remote controller could be programmable so that each theme key can be programmed by the user to correspond to a particular theme. For example, means can be provided in the remote controller to allow the user to change the news key 34 to an education key, for example. One way that the theme keys can be changed to different themes is to provide the user with labels that can be easily attached to the remote controller to label the keys.

The remote controller can also be designed so that a theme is accessed by using the number keys. For example, the user could designate the code *03* for the sports theme and code *02* for the news theme. By assigning codes, it is possible to greatly expand the number of effective theme keys.

It is also possible for the user to program into the remote controller the period of time that a particular channel is displayed before another channel in the same theme is displayed. For example, a set time period, the purpose of which is further explained below, can be set to 5 seconds or 15 seconds.

Once the user has stored channels under the theme keys, and initialized the set time period, the user can view channels under a particular theme key by pressing the theme key. When the user presses a theme key, a channel number in the theme memory for that theme key is accessed. Then the remote controller transmits the channel number to the television system. The television system tunes to the received channel and displays the channel for a set time period. If the theme key is not pressed during a set time period such as 5 seconds, the remote controller accesses another channel number stored in the theme memory for the theme key and the channel number is transmitted to the television system, which then displays the new channel. This continues with each channel stored under the theme key in the theme memory being displayed in turn. As illustrated in FIG. 3 the pointer 110 will cycle between the channels stored under the sports key. For example ESPN will be shown on the television system for a set time period which could be five seconds and then the Prime Ticket channel will be shown followed by the ABC channel, and then the CBS channel. Then the pointer will cycle again to the ESPN channel. This continues until the user presses the theme key again, which stops the remote controller from accessing the next channel number in the theme memory for that theme. Instead, the tuner remains at the channel to which the tuner is set at the time the theme key is pressed and the television system displays the program on the last accessed channel number.

This system enables the user to eliminate channels that are not of interest when deciding upon a program to watch. The user surfs or scans through only the channels corresponding to a particular theme and this surfing is done automatically. This is vastly more advantageous than current remote controllers that require the user to continue to press the channel up or channel down key to surf through all the television channels to find channels with a particular theme.

FIG. 3 shows that there are separate pointers for each theme key such as pointers 112, 114, 116, 118 and 120. When a user presses a theme key for the first time, the pointer corresponding to the theme key will access the theme memory in the location last accessed by that theme key. For example, if the last accessed channel under the kids theme key was Nickelodian, then when the theme key is pressed for the first time the first channel displayed is Nickelodian and then after five seconds the Discovery channel is displayed and so on.

Alternately the pointer can be reset to follow the same specific order in the list of channels in the theme memory each time the user uses a theme key to access channels in the theme. For example, if the last accessed channel under the kids theme key was Nickelodian, then when the theme key is pressed for the first time, the first channel displayed is The Disney Channel, because it is first in the list of channels under the KIDS theme, as shown in FIG. 3. This in effect makes the sequencing of the channel surfing, the same as the input sequence.

In another embodiment of the invention, each time a theme key is pressed the remote controller accesses another channel number from the list of channels stored for the theme key. When the user presses the theme key again, the next channel number stored for the theme key is accessed and so on. Using this feature the user can scan through selected channels at the rate desired by the user. For example, the user may watch one sports channel for ten minutes, before pressing the sports key again to watch the next sports channel in the memory of the remote controller.

Another embodiment of the invention is to display the channels accessed when a theme key is pressed as small picture-in-picture displays. FIG. 1 illustrates a television having a main screen 224 and a picture-in-picture display 222. A picture-in-picture display is a small television display that is within a main television display. In this embodiment, when the theme button is pushed for the first time, the channel surfing will start and the accessed channels will be displayed in turn as a small picture-in-picture. The background channel will remain unchanged. Then when the theme button is pressed again, the display on the picture-in-picture will continue to display the last accessed channel number. If the theme key is pressed a third time then the picture-in-picture will switch to the full screen and display the program on the last accessed channel on the full screen.

Figure 4:
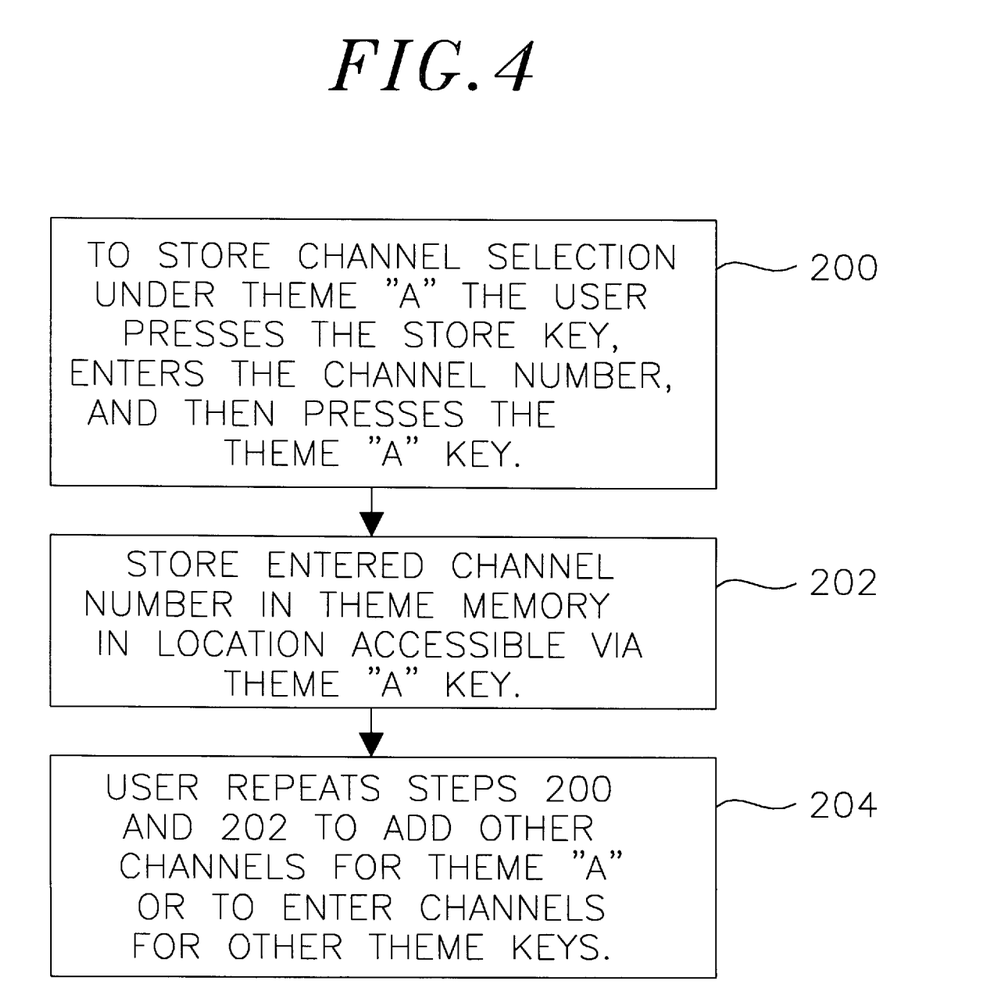
FIGS. 4 to 6 are flow diagrams of methods for selecting channels on a television system by theme according to the present invention.
Figure 5:
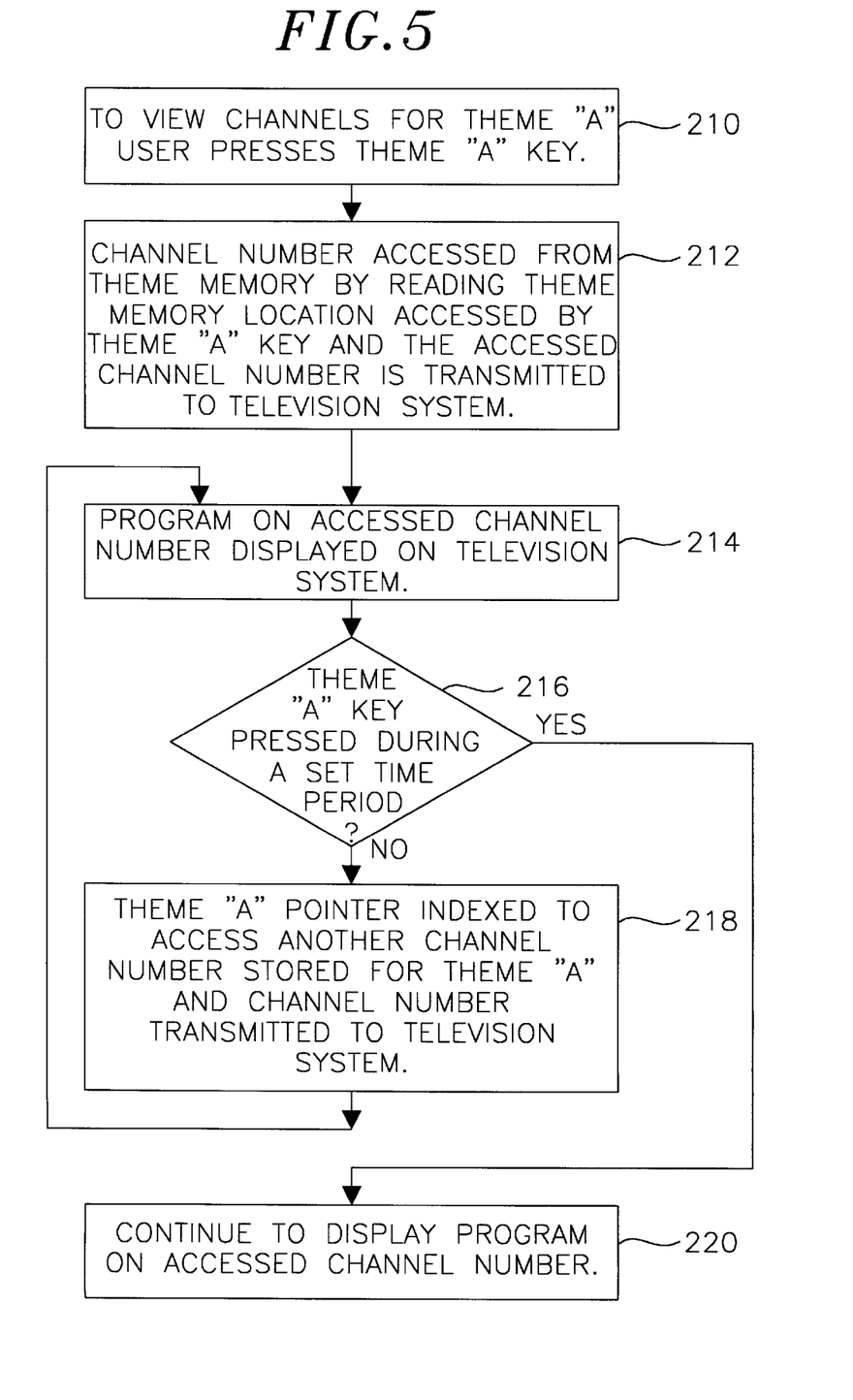
Figure 6:
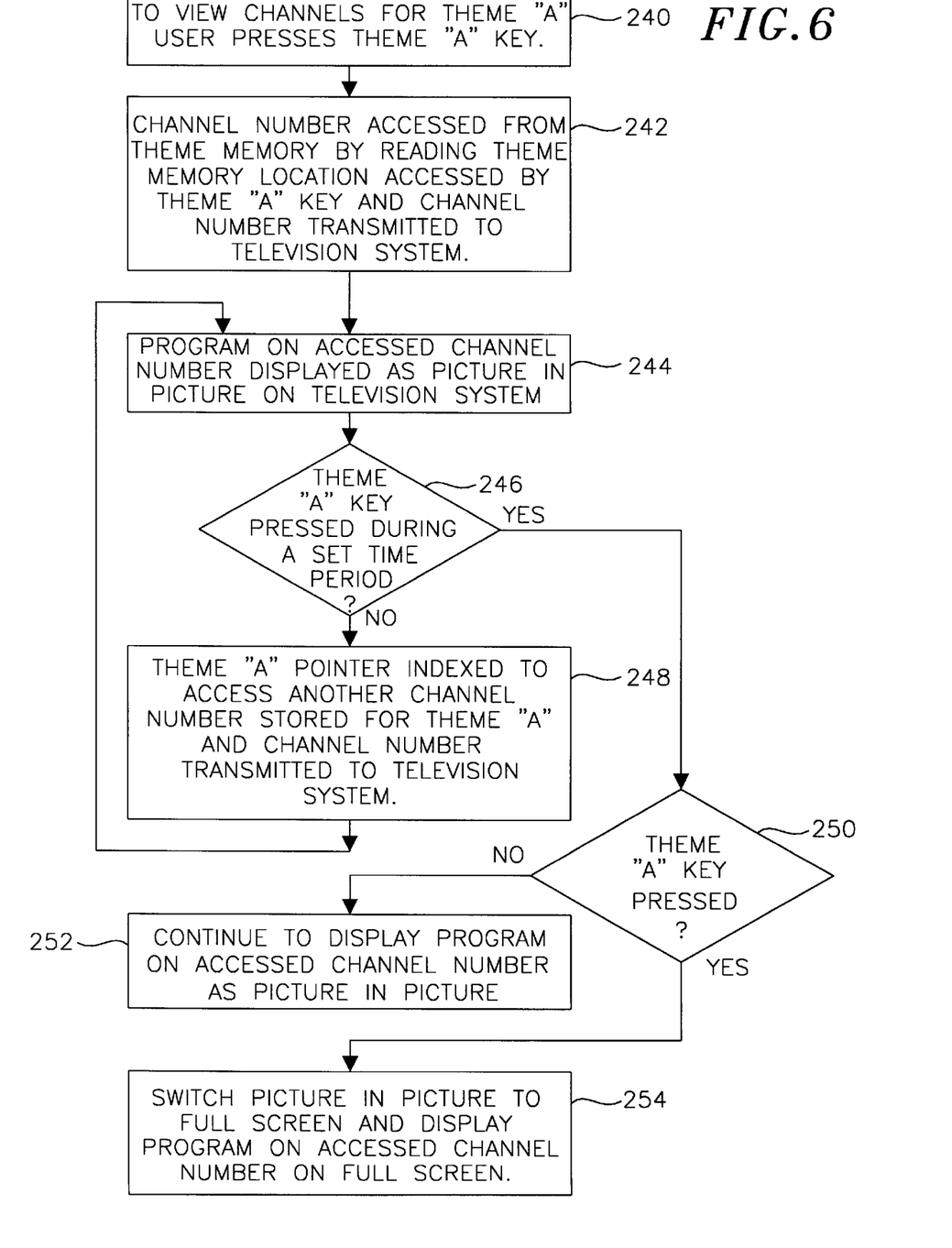

FIGS. 4–6 are flow diagrams of methods for selecting channels on a television system by theme according to the present invention.

FIG. 4 is a flow diagram of a method for storing channels under theme keys. In step 200 the user presses the store key, enters the channel number and then presses the theme key. For example, to store channel selections under theme "A" the user presses the theme "A" key. Then in step 202 the remote controller stores the entered channel number in the theme memory in a location accessible via the theme "A" key. In step 204 the user repeats steps 200 and 202 to add other channels for theme "A" or to enter channels for other theme keys.

FIG. 5 is a flow diagram of a method for selecting channels on a television by theme. In step 210, the user presses a theme key, such as theme "A" key. Then in step 212, a channel number is accessed from the theme memory by reading the theme memory location accessed by theme "A" key and the channel number is transmitted to the television system. Then in step 214, the program on the accessed channel number is displayed on the television system. Then in step 216 it is determined whether the theme "A" key has been pressed during a set time period. For example, the set time period could be five seconds. This is enough time for the user to watch the channel to determine whether the user wishes to continue to view the channel. If the user does, then the user presses the theme "A" key. If the user wishes to continue to scan the channels automatically or to surf the channels, then the user does not press the theme key and then in step 218 the theme "A" pointer is indexed to access another channel number stored for theme "A." The accessed channel number is transmitted to the television system which in step 214 displays the accessed channel number. If in step 216 the user presses the theme "A" key, then in step 220 the accessed channel number continues to be displayed on the television system.

FIG. 6 is a flow diagram of an alternate method for selecting channels on a television system by theme. In step 240, the user presses a theme key such as theme "A" key. Then in step 242 a channel number is accessed from the theme memory by reading the theme memory location accessed by theme "A" key. The accessed channel number is then transmitted to the television system. Then in step 244, the accessed channel number is displayed as a picture-in-picture on the television system. Then in step 246 it is determined whether the theme "A" key has been pressed during a set time period. If the theme "A" key has not been pressed, then in step 248 the theme "A" pointer is indexed to access another channel number stored for theme "A" and the accessed channel number is transmitted to the television system. If in step 246 it is determined that the theme "A" key has been pressed during the set time period such as during a five second period, then in step 250 it is determined whether the theme "A" key has been pressed yet again. If the theme key has not been pressed again, then in step 252 the program on the last accessed channel number is displayed as a picture-in-picture. If in step 250 it is determined that the theme key has been pressed again during the set time period, then in step 254 the picture-in-picture is switched to the full television screen, which displays the program on the last accessed channel.

The described embodiments of the invention are only considered to be preferred and illustrative of the inventive concept, the scope of the invention is not to be restricted to such embodiments. Various and numerous other arrangements may be devised by one skilled in the art without departing from the spirit and scope of this invention.

It is therefore intended by the appended claims to cover any and all such applications, modifications and embodiments within the scope of the present invention.

What is claimed is:

1. A method for surfing a spectrum of television channels on which programs are telecast, the method comprising the steps of:

tuning a television receiver to a given channel;

displaying on a television screen a foreground field and a background field;

inserting the program being telecast on the given channel in one of the fields;

sequentially inserting programs being telecast on other channels in the other field;

generating a full screen command signal; and displaying on the screen full frame the program being telecast on the other channel when the command signal is generated.

2. The method of claim 1, additionally comprising the step of generating a channel sequencing command signal and the sequentially inserting step inserts a program each time the channel sequencing command signal is generated.

3. The method of claim 2, in which the sequentially inserting step inserts a program if the sequencing command signal is not generated after a set period of time.

4. The method of claim 1, in which the foreground field is a PIP window and the step of sequentially inserting the programs being telecast on other channels inserts the programs in the PIP window.

5. The method of claim 2, in which the other field is a PIP window and the step of sequentially inserting programs being telecast on the other channels inserts the programs in the PIP window.

6. A method of surfing a spectrum of television channels that carry programs with a television receiver having a display monitor and a channel selector, the method comprising the steps of:

storing in a memory a group of channels and time periods of the day when individual channels of the stored group are enabled for viewing;

sequentially retrieving the enabled channels of the group during each time period;

sequentially setting the channel selector to each of the retrieved channels; and sequentially displaying the programs on each of the retrieved channels on the monitor.

7. The method of claim 6, in additionally comprising the step of issuing sequential commands that control the retrieving, setting, and displaying steps.

8. The method of claim 7, in which a hand held remote controller issues the commands responsive to manual inputs.

9. The method of claim 8, in which a command is issued after a set period of time if no manual input occurs.

* * * * *